United States Patent [19]

Tanabe et al.

[11] Patent Number: 5,792,274
[45] Date of Patent: Aug. 11, 1998

[54] REMOVER SOLUTION COMPOSITION FOR RESIST AND METHOD FOR REMOVING RESIST USING THE SAME

[75] Inventors: Masahito Tanabe; Kazumasa Wakiya; Masakazu Kobayashi; Toshimasa Nakayama, all of Kanagawa, Japan

[73] Assignee: Tokyo Ohka Kogyo Co., Ltd., Kanagawa, Japan

[21] Appl. No.: 747,898

[22] Filed: Nov. 13, 1996

[30] Foreign Application Priority Data

Nov. 13, 1995 [JP] Japan ................ 7-317035
Jun. 21, 1996 [JP] Japan ................ 8-179872

[51] Int. Cl.$^6$ .............. B08B 3/04; B08B 3/08; C11D 7/10; C11D 7/50
[52] U.S. Cl. ............ 134/1.3; 134/2; 134/3; 134/40; 134/42; 510/176; 510/255; 510/258; 510/264; 510/269; 510/401; 510/402
[58] Field of Search ............ 510/176, 255, 510/258, 264, 269, 401, 402; 134/1.3, 2, 3, 40, 42

[56] References Cited

U.S. PATENT DOCUMENTS

| | | | |
|---|---|---|---|
| 3,890,176 | 6/1975 | Bolon | 156/2 |
| 4,165,295 | 8/1979 | Vander Mey | 252/143 |
| 4,171,240 | 10/1979 | Wong | 156/630 |
| 4,215,005 | 7/1980 | Vander Mey | 252/153 |
| 5,030,319 | 7/1991 | Nishino et al. | 156/635 |
| 5,308,745 | 5/1994 | Schwartzkopf | 430/329 |
| 5,320,709 | 6/1994 | Bowden et al. | 156/667 |
| 5,376,236 | 12/1994 | Hanson et al. | 156/664 |
| 5,454,901 | 10/1995 | Tsuji | 156/643.1 |
| 5,478,436 | 12/1995 | Winebarger et al. | 156/636.1 |
| 5,571,447 | 11/1996 | Ward et al. | 510/206 |

FOREIGN PATENT DOCUMENTS

| | | |
|---|---|---|
| 0578507 | 1/1994 | European Pat. Off. . |
| 0662705 | 7/1995 | European Pat. Off. . |
| 0680078 | 11/1995 | European Pat. Off. . |
| 6488548 | 4/1989 | Japan . |
| 3205465 | 9/1991 | Japan . |
| 5259066 | 10/1993 | Japan . |
| 8202052 | 8/1996 | Japan . |

OTHER PUBLICATIONS

Derwent Publications Ltd., London, GB; AN 81–56464D XP002024479 & SU 777 887 A (Suchko L.A.) 8 Nov. 1980, Abstract.

Derwent Publications Ltd., London, GB; AN 96–416309 XP002024480 & JP 08 202 052 A (Tokyo Ohka Kogyo Co Ltd), 9 Aug. 1996, Abstract.

*Primary Examiner*—Paul Lieberman
*Assistant Examiner*—Gregory R. Delcotto
*Attorney, Agent, or Firm*—Sughrue, Mion, Zinn, Macpeak & Seas, PLLC

[57] ABSTRACT

A remover solution composition for resist which comprises (a) a salt of hydrofluoric acid with a metal-free base, (b) a water-soluble organic solvent, and (c) water and optionally (d) an anticorrosive, and has a pH of 5 to 8. A method for removing resist which comprises the steps of (I) forming a resist layer on a substrate having a metal film, (II) light-exposing the resist layer through a mask pattern and subsequently developing the resist layer to form a resist pattern, and (III) dry-etching the substrate using the resist pattern as a mask and then removing the unnecessary resist and modified resist film with the remover solution composition.

7 Claims, No Drawings

REMOVER SOLUTION COMPOSITION FOR RESIST AND METHOD FOR REMOVING RESIST USING THE SAME

FIELD OF THE INVENTION

The present invention relates to a remover solution composition for resist and a method for removing resist using the same. More particularly, the present invention relates to a remover solution composition for resist and a method for removing resist using the same which are advantageously used in the production of semiconductor elements, e.g., IC's and LSI's, or liquid-crystal panel elements, have high removing performance at a low temperature (room temperature), do not corrode electroconductive metal films, are highly safe, and can be easily handled.

BACKGROUND OF THE INVENTION

Semiconductor elements such as IC's and LSI's and liquid-crystal panel elements are produced by evenly applying a photoresist to an electroconductive film of a metal, e.g., aluminum, copper, or an aluminum alloy, formed on a substrate or to an insulating film, e.g., $SiO_2$ film, formed on a substrate, light-exposing the resist layer or drawing an image thereon with an electron beam, subsequently developing the resist layer to form a resist pattern, selectively etching the electroconductive metal film or insulating film using the pattern as a mask to form a fine circuit, and then removing the unnecessary resist layer with a remover solution.

Conventionally used resist remover solutions for removing resist include organic sulfonic acid-based remover solutions containing an alkylbenzenesulfonic acid as an essential component and organic amine-based remover solutions containing an organic amine, e.g., monoethanolamine, as an essential component. However, the organic sulfonic acid-based remover solutions have a drawback that since they contain a highly toxic organic solvent, such as a phenol compound or chlorobenzene, not only use of the remover solutions results in poor working efficiency and poses an environmental problem, but also the remover solutions are apt to corrode electroconductive metal films on substrates and the like. In contrast, the organic amine-based remover solutions are less toxic than the organic sulfonic acid-based remover solutions, do not require a troublesome wastewater treatment of the organic sulfonic acid-based remover solutions, are effective in removing modified films resulting from treatments such as dry etching, ashing, ion implantation, and the like, and are highly inhibited from corroding substrates having provided thereon Al, Cu, and the like. Because of these advantages, the organic amine-based remover solutions are currently used extensively.

However, as a result of the recent trend toward severer conditions for treatments such as dry etching, ashing, ion implantation, and the like in processes for producing semiconductor elements or liquid-crystal panel elements, these treatments have come to modify originally organic resist films to films having inorganic properties. The modified films cannot be sufficiently removed even with organic amine-based remover solutions. Another drawback of organic amine-based remover solutions is that since they are used at a relatively high temperature of 60° to 130° C., there is a danger that the flammable organic compounds contained therein volatilize and catch fire. Consequently, the removing treatment is generally performed in an inflammation-preventive apparatus, and requires much equipment cost. In addition, since this prior art removing treatment using the organic amine-based remover solution takes much time, the remover solutions becomes unsatisfactory for use in the production of semiconductor elements and liquid-crystal panel elements in which a high throughput (the number of wafers treated per unit time) is required. Remover solutions usable at a low temperature (room temperature) are disclosed in JP-A-64-88548 and JP-A-5-259066 (the term "JP-A" as used herein means an "unexamined published Japanese patent application"); however, both of them contain an organic amine and water and hence has drawbacks of insufficient removing performance and a strong tendency to corrode substrates.

Under these circumstances, the present inventors proposed in JP-A-8-202052 a remover solution composition for resist which is free from the above drawbacks and comprises hydrofluoric acid optionally containing ammonium fluoride, i.e., so-called buffered hydrofluoric acid, a water-soluble organic solvent, and an anticorrosive. However, since the above remover solution composition for resist contains hydrofluoric acid, it is not quite safe for the human body and is difficult to handle. Furthermore, since the above composition is acidic, it is apt to corrode peripheral devices including remover solution feed facilities which connect a removing tank to a remover container. Other drawbacks of the above composition include the necessity of troublesome treatments of exhaust and wastewater of the remover solution composition for resist.

SUMMARY OF THE INVENTION

As a result of intensive studies made by the present inventors in order to develop a remover solution composition for resist free from the problems described above, it has been found that a remover solution composition for resist comprising (a) a salt of hydrofluoric acid with a metal-free base, (b) a water-soluble organic solvent, and (c) water, and having a hydrogen ion concentration (pH) of 5 to 8, and a method for removing resist using the same are effective in performing low-temperature removing treatment in a short time period, do not corrode a thin metal film on a substrate, peripheral devices, and the like, have low toxicity, and enable exhaust and wastewater treatments to be performed easily. They have further found that incorporation of (d) an anticorrosive into the above remover solution composition for resist is effective in further improving the noncorrosive properties of the composition. The present invention has been completed based on these findings.

An object of the present invention is to provide a remover solution composition for resist with which a modified film resulting from a treatment, such as dry etching, ashing, ion implantation, and the like, can be removed at a low temperature (room temperature) in a short time period and which never corrodes a metal film on a substrate or peripheral devices.

Another object of the present invention is to provide a remover solution composition for resist which is highly safe, can be handled easily, and does not require a troublesome exhaust or wastewater treatment.

This and other objects of the present invention have been accomplished by a remover solution composition for resist which comprises the following components: (a) a salt of hydrofluoric acid with a metal-free base, (b) a water-soluble organic solvent, and (c) water, and optionally contains an anticorrosive as component (d), and has a hydrogen ion concentration (pH) of 5 to 8.

Furthermore, this and other objects of the present invention have been accomplished by a method for removing resist which comprises the steps of: (I) forming a resist layer on a substrate having a metal film, (II) light-exposing the resist layer through a mask pattern and subsequently developing the resist layer to form a resist pattern, and (III) dry-etching the substrate using the resist pattern as a mask and then removing the unnecessary resist and modified resist film with the above-described remover solution composition for resist.

DETAILED DESCRIPTION OF THE INVENTION

As described above, the remover solution composition for resist of the present invention (hereinafter often simply referred to as "the composition of the present invention") contains (a) a salt of hydrofluoric acid with a metal-free base. The term "metal-free base" as used herein means a base containing no metal in the molecule and include hydroxylamines, organic amines (e.g., primary, secondary, or tertiary aliphatic, alicyclic, aromatic, and heterocyclic amines), ammonia water, and lower alkyl quaternary ammonium salt groups (the term "lower alkyl" as used herein means "alkyl having from 1 to 4 carbon atoms ($C_1$ to $C_4$)"). Examples of the hydroxylamines include hydroxylamine and N,N-diethylhydroxylamine. Examples of the primary aliphatic amines include monoethanolamine, ethylenediamine, and 2-(2-aminoethylamino)ethanol. Examples of the secondary aliphatic amines include diethanolamine, dipropylamine, and 2-ethylaminoethanol. Examples of the tertiary aliphatic amines include dimethylaminoethanol and ethyldiethanolamine. Examples of the alicyclic amines include cyclohexylamine and dicyclohexylamine. Examples of the aromatic amines include benzylamine, dibenzylamine, and N-methylbenzylamine. Examples of the heterocyclic amines include pyrrole, pyrrolidine, pyrrolidone, pyridine, morpholine, pyrazine, piperidine, N-hydroxyethylpiperidine, oxazole, and thiazole. Examples of the $C_1$ to $C_4$ lower alkyl quaternary ammonium salt groups include tetramethylammonium hydroxide and trimethyl(2-hydroxyethyl)-ammonium hydroxide (choline). Preferred metal-free bases are ammonia water, monoethanolamine, and tetramethylammonium hydroxide, because these bases are easily available and safe. A salt of the metal-free base with hydrofluoric acid can be produced by adding the metal-free base to commercial hydrofluoric acid having a hydrogen fluoride concentration of 50 to 60% in such a proportion as to result in a pH of 5 to 8. Commercial ammonium fluoride is, of course, usable as the salt.

The composition of the present invention has an almost neutral pH value of 5 to 8. This pH range may be attained by using component (a) which is almost neutral. The proportion of hydrofluoric acid to a metal-free base to be added thereto so as to attain a neutral pH value varies depending on the kind of the base, and cannot hence be shown unconditionally. For example, in the case of ammonia water, component (a) having a pH value in the desired range can be prepared by mixing hydrofluoric acid with ammonia water having the same molar concentration in a proportion of 1/1 by volume. In the case of ethanolamine, component (a) having a pH value in the desired range can be prepared by mixing 1,000 ml of 1 mol/l hydrofluoric acid with 1 mol of monoethanolamine. Use of component (a) having a pH value in the above-specified range enables the composition of the present invention to be handled safely while maintaining the removability of modified films and inhibiting the composition from corroding a metal film on a substrate or peripheral devices including a remover feeder. Furthermore, a low hydrogen fluoride content of component (a) eliminates the necessity of troublesome exhaust and wastewater treatments, which are necessary in resist removing processes where hydrogen fluoride generates.

Any organic solvent may be used as component (b) in the present invention, as long as it is miscible with components (a), (c), and (d). Water-soluble organic solvents used in conventional organic amine-based remover solution compositions may be used. Examples of the water-soluble organic solvents include sulfoxides (e.g., dimethyl sulfoxide), sulfones (e.g., dimethyl sulfone, diethyl sulfone, bis(2-hydroxyethyl) sulfone, tetramethylene sulfone), amides (e.g., N,N-dimethylformamide, N-methylformamide, N,N-dimethylacetamide, N-methylacetamide, N,N-diethylacetamide), lactams (e.g., N-methyl-2-pyrrolidone, N-ethyl-2-pyrrolidone, N-propyl-2-pyrrolidone, N-hydroxymethyl-2-pyrrolidone, N-hydroxyethyl-2-pyrrolidone), imidazolidinones (e.g., 1,3-dimethyl-2-imidazolidinone, 1,3-diethyl-2-imidazolidinone, 1,3-diisopropyl-2-imidazolidinone), lactones (e.g., γ-butyrolactone, δ-valerolactone), and polyhydric alcohols (e.g., ethylene glycol, ethylene glycol monomethyl ether, ethylene glycol monoethyl ether, ethylene glycol monobutyl ether, ethylene glycol monomethyl ether acetate, ethylene glycol monoethyl ether acetate, diethylene glycol, diethylene glycol monomethyl ether, diethylene glycol monoethyl ether, diethylene glycol monobutyl ether); and derivatives thereof. Among these, preferred are dimethyl sulfoxide, N,N-dimethylformamide, N,N-dimethylacetamide, N-methyl-2-pyrrolidone, 1,3-dimethyl-2-imidazolidinone, ethylene glycol, and diethylene glycol monobutyl ether, because these solvents bring about the removability of modified resist films. In particular, use of a water-soluble organic solvent comprising at least 10% by weight (wt %) ethylene glycol as component (b) is preferred in that the composition of the present invention containing this component (b) is highly inhibited from corroding a metal deposition substrate in the removing of a holed resist pattern. In this case, ethylene glycol alone may be used as component (b) because the higher the ethylene glycol content, the higher the anticorrosive effect. A mixture of 40 to 60 wt % of ethylene glycol and 60 to 40 wt % of dimethyl sulfoxide is also advantageous.

In the case where the composition of the present invention comprises components (a), (b), and (c), it is desirable that the content of component (a) is from 0.2 to 8% by weight, preferably from 0.5 to 5% by weight; the content of component (b) is from 30 to 90% by weight, preferably from 40 to 70% by weight; and the remainder is component (c). By regulating the contents of the components within the respective ranges shown above, the removability of modified films, removability at room temperature, and substrate-noncorrosive properties are improved. In particular, use of the above ranges is essential when the resist film to be removed is present on a readily corrodible metal deposition substrate, such as a substrate containing deposited Al, Al—Si, or Al—Si—Cu. If the content of component (a) is lower than the lower limit of the range specified above, the removability of modified films is impaired. If the content thereof is higher than the higher limit, substrate corrosion is apt to occur.

In addition to components (a) to (c) described above, component (d) can be contained in the composition of the present invention. By the incorporation of component (d), the composition of the present invention can be more effectively inhibited from corroding substrates susceptible to corrosion, such as Al, Al—Si, Al—Si—Cu substrates, without deteriorating the removability of modified films. Examples of the anticorrosive used as component (d) include aromatic hydroxyl compounds, acetylene alcohols, carboxyl group-containing organic compounds and anhydrides thereof, triazole compounds, and saccharides. Examples of the aromatic hydroxyl compounds include phenol, cresol, xylenol, pyrocatechol, resorcinol, hydroquinone, pyrogallol, 1,2,4-benzenetriol, salicyl alcohol, p-hydroxybenzyl alcohol, o-hydroxybenzyl alcohol, p-hydroxyphenethyl alcohol, p-aminophenol, m-aminophenol, diaminophenol, aminoresorcinol, p-hydroxybenzoic acid, o-hydroxybenzoic acid, 2,4-dihydroxybenzoic acid, 2,5-dihydroxybenzoic acid, 3,4-dihydroxybenzoic acid, and 3,5-dihydroxybenzoic acid. Among these, preferred is pyrocatechol.

Examples of the acetylene alcohols include 2-butyne-1,4-diol, 3,5-dimethyl-1-hexyn-3-ol, 2-methyl-3-butyn-2-ol, 3-methyl-1-pentyn-3-ol, 3,6-dimethyl-4-octyne-3,6-diol, 2,4,7,9-tetramethyl-5-decyne-4,7-diol, and 2,5-dimethyl-3-hexyne-2,5-diol. Among these, preferred is 2-butyne-1,4-diol.

Examples of the carboxyl group-containing organic compounds and anhydrides thereof include formic acid, acetic acid, propionic acid, butyric acid, isobutyric acid, oxalic acid, malonic acid, succinic acid, glutaric acid, maleic acid, fumaric acid, benzoic acid, phthalic acid, 1,2,3-benzenetricarboxylic acid, glycolic acid, lactic acid, malic acid, citric acid, acetic anhydride, phthalic anhydride, maleic anhydride, succinic anhydride, and salicylic acid. Among these, preferred are formic acid, phthalic acid, benzoic acid, phthalic anhydride, and salicylic acid, and especially preferred are phthalic acid, phthalic anhydride, and salicylic acid.

Examples of the triazole compounds include benzotriazole, o-tolyltriazole, m-tolyltriazole, p-tolyltriazole, carboxybenzotriazole, 1-hydroxybenzotriazole, nitrobenzotriazole, and dihydroxypropylbenzotriazole. Among these, preferred is benzotriazole.

Examples of the saccharides include D-sorbitol, arabitol, mannitol, sucrose, and starch. Among these, preferred is D-sorbitol.

The anticorrosives enumerated above may be used either alone or in combination of two or more thereof.

In the case where the composition of the present invention comprises components (a) to (d), it is desirable that the content of component (a) is from 0.2 to 8% by weight, preferably from 0.5 to 5% by weight; the content of component (b) is from 40 to 80% by weight, preferably from 55 to 75% by weight; the content of component (d) is from 0.5 to 15% by weight, preferably from 0.5 to 10% by weight; and the remainder is component (c). If the amount of each component is outside the range shown above, the composition is impaired in the removability of modified films and in noncorrosive properties.

The composition of the present invention can be advantageously used for any resists including negative and positive resists developable with an aqueous alkali solution. Examples of the resists include (i) a positive resist comprising a naphthoquinonediazide compound and a novolak resin, (ii) a positive resist comprising an acid-generating compound upon light exposure, a compound which is decomposed by the acid to show enhanced solubility in aqueous alkali solutions, and an alkali-soluble resin, (iii) a positive resist comprising an acid-generating compound upon light exposure and an alkali-soluble resin containing groups which are decomposed by the acid to show enhanced solubility in aqueous alkali solutions, and (iv) a negative resist comprising an acid-generating compound upon light exposure, a crosslinking agent, and an alkali-soluble resin. However, the resists to which the composition of the present invention is applicable are not limited thereto.

The method for removing resist of the present invention comprises applying the resist composition described above to a substrate having a metal film to form a resist layer, light-exposing the resist layer through a mask pattern in an ordinary way, subsequently developing the resist layer to form a resist pattern, dry-etching the substrate by a known technique using the resist pattern as a mask, optionally subjecting the etched substrate to a further treatment, such as ashing, ion implantation, and the like, and then contacting the substrate with the composition of the present invention by immersion or another means to thereby remove the unnecessary resist and modified resist film.

The composition of the present invention is effective in removing resist films at a low temperature (room temperature) in a short time period even when the resist films had been modified under severe treatment conditions, and never corrodes readily corrodible substrates, e.g., Al, Al—Si, and Al—Si—Cu substrates, or peripheral devices. Moreover, the composition of the present invention is neutral and safe, can be easily handled, does not generate hydrogen fluoride, and has a further advantage that exhaust and wastewater treatments are easy.

The present invention will be explained below in more detail by reference to Examples, but the invention should not be construed as being limited to these Examples in any way.

EXAMPLES 1 TO 7

A silicon wafer having a vapor-deposited Al—Si—Cu film about 1.0 µm thick was coated by spinner coating with THMR-iP3300 (manufactured by Tokyo Ohka Kogyo Co., Ltd.), which is a positive resist comprising a naphthoquinonediazide compound and a novolak resin. The coating was subjected to pre-exposure baking at 90° C. for 90 seconds to form a resist layer having a thickness of 2.0 µm. This resist layer was exposed using NSR-2005i10D (manufactured by Nikon Corp.) through a mask pattern, and then developed with 2.38 wt % aqueous tetramethylammonium hydroxide solution to form a resist pattern. Post-development baking was then conducted at 120° C. for 90 seconds.

The silicon wafer having a vapor-deposited Al—Si—Cu film about 1.0 µm thick which had the resist pattern described above was etched for 168 seconds with a chlorine/boron trichloride mixed gas as an etchant using etching apparatus TSS-6000 (manufactured by Tokyo Ohka Kogyo Co., Ltd.) at a pressure of 5 Torr and a stage temperature of 20° C. Subsequently, an after-corrosion treatment was performed for 30 seconds using an oxygen/trifluoromethane mixed gas at a pressure of 20 Torr and a stage temperature of 20° C. After the above treatment, ashing treatment with oxygen gas was further performed for 150 seconds using ashing apparatus TCA-2400 (manufactured by Tokyo Ohka Kogyo Co., Ltd.) under the conditions of a pressure of 0.3 Torr and a stage temperature of 60° C.

The thus-treated silicon wafer was immersed at 23° C. for 5 minutes in one of remover solution compositions respectively having the compositions shown in Table 1 to conduct removing treatment. Each treated substrate was rinsed with pure water, and then evaluated for the removability of the ashing residue from the silicon wafer (removability of modified film) and for the corrosion of the Al—Si—Cu film based on an examination of photographs thereof taken with an SEM (scanning electron microscope). These properties were evaluated based on the following criteria. The results obtained are shown in Table 1 below.

COMPARATIVE EXAMPLES 1 TO 4

The removability of modified films and corrosion were evaluated in the same manner as in the above Examples, except that the compositions of remover solution compositions were changed as shown in Table 1. The results obtained are shown in Table 1 below.

THMR-iP3300 (manufactured by Tokyo Ohka Kogyo Co., Ltd.), which is a positive resist comprising a naphthoquinonediazide compound and a novolak resin. The coating was subjected to pre-exposure baking at 90° C. for 90 seconds to form a resist layer having a thickness of 2.0 µm. This resist layer was irradiated with i-rays (365 nm) using contracting projection exposure apparatus NSR-2005i10D (manufactured by Nikon Corp.) through a mask pattern, and then developed with 2.38 wt % aqueous tetramethylammonium hydroxide solution to form a holed resist pattern.

The silicon wafer having a vapor-deposited Al—Si—Cu film about 1.0 µm thick which had the holed resist pattern

TABLE 1

| | Components of remover solution composition for resist (% by weight) | | | | | | | Removability of modified film | Corrosion | pH |
|---|---|---|---|---|---|---|---|---|---|---|
| | Component (a) | | Component (b) | | Component (c) | | Component (d) | | | |
| Example 1 | A.HF | (1) | DMSO | (49) | Water (50) | | — | Good | Good | 7.0 |
| Example 2 | A.HF | (2) | DMSO | (88) | Water (10) | | — | Good | Good | 6.0 |
| Example 3 | A.HF | (1) | NMP | (44) | Water (50) | | PC (5) | Good | Good | 7.5 |
| Example 4 | MEA.HF | (1) | DMI | (50) | Water (48) | | BT (1) | Good | Good | 8.0 |
| Example 5 | MEA.HF | (1) | DMSO | (70) | Water (24) | | PC (5) | Good | Good | 7.0 |
| Example 6 | TMAH.HF | (2) | DMSO | (60) | Water (38) | | — | Good | Good | 5.0 |
| Example 7 | A.HF | (1) | NMP | (49) | Water (45) | | D-sorbitol (5) | Good | Good | 7.0 |
| Comparative Example 1 | NH$_4$F.HF | (1) | — | | Water (99) | | — | Good | Bad | 2.0 |
| Comparative Example 2 | A.HF | (2) | — | | Water (98) | | — | Good | Bad | 7.0 |
| Comparative Example 3 | — | | DMSO | (50) | Water (45) | | PC (5) | Bad | Good | 7.0 |
| Comparative Example 4 | TMAH.HF | (2) | — | | Water (98) | | — | Good | Bad | 7.0 |

(NOTES)

Evaluation:
Removability of modified film
   Good: satisfactory removability
   Bad: incomplete removing
Corrosion
   Good: no corrosion
   Bad: corroded
Abbreviation:
A.HF: ammonium fluoride salt
MEA.HF: monoethanolamine salt of hydrofluoric acid
TMAH.HF: tetramethylammonium hydroxide salt of hydrofluoric acid
DMSO: dimethyl sulfoxide
DMI: 1,3-dimethyl-2-imidazolidinone
NMP: N-methyl-2-pyrrolidone
BT: benzotriazole
PC: pyrocatechol
NH$_4$F.HF: acidic ammonium fluoride As apparent the results shown in Table 1, the remover solution compositions for resist of the present invention were effective in satisfactorily removing modified films at a low temperature (room temperature) in a short time period and did not corrode the substrate, despite the neutrality thereof.

EXAMPLE 8

A silicon wafer having a vapor-deposited Al—Si—Cu film about 1.0 µm thick was coated by spinner coating with described above was etched for 168 seconds with a chlorine/boron trichloride mixed gas as an etchant using etching apparatus TSS-6000 (manufactured by Tokyo Ohka Kogyo Co., Ltd.) at a pressure of 5 Torr and a stage temperature of 20° C. Subsequently, an after-corrosion treatment was performed for 30 seconds using an oxygen/trifluoromethane mixed gas at a pressure of 20 Torr and a stage temperature of 20° C. After the above treatment, ashing treatment with oxygen gas was further performed for 150 seconds using ashing apparatus TCA-2400 (manufactured by Tokyo Ohka Kogyo Co., Ltd.) under the conditions of a pressure of 0.3 Torr and a stage temperature of 60° C.

The thus-treated silicon wafer was immersed at 23° C. for 20 minutes in a remover solution composition containing 68.9 wt % ethylene glycol, 30 wt % water, 1.0 wt % ammonium fluoride, and 0.1 wt % hydrogen fluoride to conduct removing treatment. The treated substrate was rinsed with pure water, and then evaluated for the removability of the ashing residue from the silicon wafer (removability of modified film) and for the corrosion of the Al—Si—Cu film based on an examination of photographs thereof taken with an SEM (scanning electron microscope). As a result, the resist film was found to have been satisfactorily removed off without corroding the vapor-deposited metal layer on the substrate. The remover solution composition used above had a pH of 8.0.

EXAMPLE 9

The same removing treatment as in Example 8 was performed, except that a remover solution containing 68.9 wt % dimethyl sulfoxide/ethylene glycol (1/1 by weight), 30 wt % water, 1.0 wt % ammonium fluoride, and 0.1 wt % hydrogen fluoride was used in place of the remover solution composition used in Example 8. As a result, the resist film had been satisfactorily removed off without corroding the vapor-deposited metal layer. The remover solution composition used above had a pH of 8.0.

While the invention has been described in detail and with reference to specific embodiments thereof, it will be apparent to one skilled in the art that various changes and modifications can be made therein without departing from the spirit and scope thereof.

What is claimed is:

1. A method for removing resist which comprises the steps of:

(I) forming a resist layer on a substrate having a metal film, (II) light-exposing the resist layer through a mask pattern and subsequently developing the resist layer to form a resist pattern, and (III) dry-etching the substrate using the resist pattern as a mask and then removing the unnecessary resist and modified resist film with a remover solution composition for resist, wherein said remover solution composition for resist has a pH of 5 to 8 and comprises the following components: (a) 0.2 to 8% by weight of a salt of hydrofluoric acid with a metal-free base, (b) 30 to 90% by weight of a water-soluble organic solvent which is at least one solvent selected from the group consisting of dimethyl sulfoxide, 1,3-dimethyl-2-imidazolidinone, and diethylene glycol monobutyl ether, and the balance being (c) water.

2. A method for removing resist which comprises the steps of:

(I) forming a resist layer on a substrate having a metal film, (II) light-exposing the resist layer through a mask pattern and subsequently developing the resist layer to form a resist pattern, and (III) dry-etching the substrate using the resist pattern as a mask and then removing the unnecessary resist and modified resist film with a remover solution composition for resist, wherein said remover solution composition for resist has a pH of 5 to 8 and comprises the following components: (a) a salt of hydrofluoric acid with a metal-free base, (b) a water-soluble organic solvent which is at least one solvent selected from the group consisting of dimethyl sulfoxide, 1,3-dimethyl-2-imidazolidinone, and diethylene glycol monobutyl ether, (c) water, and (d) an anticorrosive agent, wherein said salt is present in an amount of 0.2 to 8% by weight, said solvent is present in an amount of 40 to 80% by weight, said anticorrosive agent is present in an amount of 0.5 to 15% by weight, and water comprises the remainder of the remover solution composition.

3. The method as claimed in claim 1, wherein component (a) is a salt of hydrofluoric acid with at least one metal-free base selected from hydroxylamines; primary, secondary, or tertiary aliphatic alicyclic, aromatic and heterocyclic amines; ammonia water; and $C_1$ to $C_4$ lower alkyl quaternary ammonium salt groups.

4. The method as claimed in claim 1, wherein component (a) is ammonium fluoride.

5. The method as claimed in claim 1, wherein the water-soluble organic solvent comprises at least 10% by weight ethylene glycol.

6. The method as claimed in claim 1, wherein component (d) is at least one selected from aromatic hydroxyl compounds, acetylene alcohols, carboxyl group-containing organic compounds and anhydrides thereof, triazole compounds, and saccharides.

7. The method as claimed in claim 2 wherein the water-soluble organic solvent comprises at least 10% by weight ethylene glycol.

* * * * *